United States Patent [19]

Burrage

[11] Patent Number: 5,389,890
[45] Date of Patent: Feb. 14, 1995

[54] COMBINERS FOR R.F. POWER AMPLIFIERS

[75] Inventor: Clement P. Burrage, Essex, United Kingdom

[73] Assignee: GEC-Marconi Limited, Middlesex, United Kingdom

[21] Appl. No.: 97,999

[22] Filed: Jul. 29, 1993

[30] Foreign Application Priority Data

Aug. 20, 1992 [GB] United Kingdom ............... 9217679

[51] Int. Cl.6 .......................... H03F 3/68; H03F 3/60
[52] U.S. Cl. .................................. 330/124 R; 330/56;
330/286; 330/295; 333/109
[58] Field of Search ................. 330/53, 54, 56, 124 R,
330/126, 286, 295; 333/109, 116

[56] References Cited

U.S. PATENT DOCUMENTS

| | | | |
|---|---|---|---|
| 3,986,147 | 10/1976 | Carter et al. | 333/1.1 |
| 4,129,840 | 12/1978 | Mok | 333/73 W |
| 4,287,605 | 9/1981 | Dydyk | 455/330 |
| 4,656,438 | 4/1987 | Levinson | 330/287 |

FOREIGN PATENT DOCUMENTS

| | | | |
|---|---|---|---|
| 2243066 | 11/1979 | France. | |
| 1390809 | 4/1975 | United Kingdom | H01P 5/02 |
| 1609120 | 12/1981 | United Kingdom | H01P 5/16 |

OTHER PUBLICATIONS

Cappucci, "Combining Amplifiers ?, Try Serial-Feed Arrays," *Microwaves*, Oct. 1976, pp. 36, 37, 40, 41.

Primary Examiner—James B. Mullins
Attorney, Agent, or Firm—Spencer, Frank & Schneider

[57] ABSTRACT

Directional couplers $7^1$–$7^{20}$ are used to couple power from r.f. power amplifier modules $5^1$–$5^{20}$ to a transmission line 6 or other type of resonator, from which it is withdrawn by directional coupler 8. The power withdrawn from the continuous transmission line, which is an integral number of wavelengths at the operating frequency of the modules in length, is less than the power circulating around the transmission line 6. The balance load may be removed to enable the output load to be combined with the output of another r.f. power amplifier operating a different frequency so that e.g. sound and vision signals can be combined at an aerial and, in the latter case, means may be provided for improving the resonance of the main loop 6.

15 Claims, 3 Drawing Sheets

COMBINERS FOR R.F. POWER AMPLIFIERS

BACKGROUND OF THE INVENTION

1 Field of the Invention

This invention relates to combiners for r.f. power amplifiers.

2 Background Information

Higher power r.f. power amplifiers for transmitters operating at higher frequencies (say HF and upwards) are tending to be made of a number of identical lower power r.f. power amplifier modules, typically solid state, of e.g. 250 to 1000 watt connected in parallel in typical numbers of up to 40 or more.

It has been proposed (FIG. 1) to couple sequentially a number (e.g. 20) of power amplifier modules $1^1 \ldots 1^{20}$ on to a transmission line 2 via directional couplers 3, to produce a combined output on load 4. Each module receives the same drive input, and the outputs are combined in parallel.

A directional coupler (FIG. 2) has four ports and the property that, assuming all ports are properly matched, a proportion of the input signal at port A appears across a load connected to port C while none appears across a balance load connected to port D (since two equal signals add at port C and subtract at port D). The remainder of the input appears across the output load. The coupling can be via discrete components or by electromagnetic coupling of e.g. two parallel conductors in an outer sheath spaced apart from each other by a certain distance over a certain length e.g. one quarter wavelength. The effective isolation of port D from the input appearing at port A enables the directional coupler to be used to combine two inputs e.g. one appearing at port A and one appearing at port D. An input appearing at port D in place of the matched load would be split between port C and port B.

In FIG. 1 the couplers are used in this way to combine two appropriately phased signals. Thus, as shown in greater detail in FIG. 3 (the coupler being shown in its symbolic form, and the phase shift across each of the paths AB, CD being 90°) a first signal entering at port A, nominal phase 0° is divided into one part leaving port B at nominal phase −90° and another part leaving port C nominal phase 0°. A second signal entering at port D, nominal phase −90° is divided into one part appearing at port C, nominal phase −180° and the remainder appearing at port B, nominal phase −90°. It will be apparent that an appropriate degree of coupling between the paths AB, CD together with appropriate relative voltage amplitudes of the alternating signals entering at ports A and D results in cancellation of the signal appearing at port C connected to the balance load and summation of the signals leaving port B.

SUMMARY OF THE INVENTION

A 180° type is an alternative to the quadrature type described, the phase difference between ports AB, CD being 180° and the relative phase of the signals fed in at ports A, D being 180°.

The degree of coupling of the coupler is defined by the coupling ratio, usually expressed in dBs, given by:

Coupling ratio $= 10 \log_{10} B/D$, where D is the power fed into the side arm of the directional coupler and B is the power emerging from the coupler (being the sum of the power fed in the side arm and the power entering on the main line of port A). Different coupling ratios imply different separations of transmission lines or different coupling components. In the case of the arrangement of FIG. 1, assuming for the sake of simplicity that each module produces 1 unit of output power, the directional coupler $1^1$ has a coupling ratio of $10 \log_{10} 2/1 = 3.01$ dB. Directional coupler $1^2$ has an input power of 2 units, a further 1 unit fed in from the side arm, and hence an output power of 3 units, and thus has a coupling ratio of $10 \log_{10} 3/1 = 4.77$ dB. Given that there are 20 modules, the coupling ratio of directional coupler $1^{20}$, having an input of 19 units from the main line and an input of 1 unit from the coupling arm is $10 \log_{10} 19 = 013.6$ dB.

A disadvantage of such an arrangement is that a range of couplers is required with the coupling ratio extending from 3 dB to 13 dB.

The invention provides a combiner for a plurality of r.f. power amplifiers having the same operating frequency as each other, comprising a respective directional coupler for coupling the output of each r.f. power amplifier on to a transmission line to combine the outputs, the transmission line forming a continuous loop the length of which is an integral number of wavelengths of the operating frequency, a directional coupler for withdrawing the combined output power from the continuous loop and the coupling ratios of the directional couplers being such that in use the circulating power in the transmission line is greater than the combined output power.

The use of the continuous loop in conjunction with the directional coupler for withdrawing power permits the use of couplers having coupling ratios which are closer to each other than to the arrangement of FIG. 1, permitting easier manufacture.

The resonator may be a continuous loop of transmission line, or a cavity or a body in which there is a rotating electric field.

Television transmitters are, in the higher powers, normally constructed with separate sound and vision power amplifiers working on adjacent but separate frequencies. These two signals are then added together in an external combiner. Likewise, a number of T.V. or sound power amplifiers each on its own channel may be combined together for connection to a common aerial. This may be achieved by using the directional coupler that is used for withdrawing the combined output power, for coupling the output of a second r.f. power amplifier having a different operating frequency to produce a combined output. This combined output e.g. sound and vision, or different vision or sound power amplifiers, may then be fed to the aerial. Indeed, the combination of outputs of different frequency is possible whether or not a plurality of power amplifiers of the same operating frequency or just a single power amplifier is coupled to continuous transmission line.

According to another aspect, therefore, the invention also provides a combiner for two r.f. power amplifiers having different operating frequencies, comprising a directional coupler for coupling the output of a first r.f. power amplifier having one operating frequency on to a transmission line, the transmission line forming a continuous loop the length of which is an integral number of wavelengths of that operating frequency, and a directional coupler for withdrawing the output power of the r.f. amplifier from the continuous loop as well as for coupling the output of a second r.f. power amplifier having a different operating frequency to produce a combined output.

The continuous loop is resonant at the frequency of the first r.f. power amplifier, so that the power of the second r.f. power amplifier operating at a different frequency cannot couple on to the loop and hence may be combined in an output load connected to the directional coupler that is used for withdrawing the output of the first r.f. power amplifier from the loop. Two ports of the coupler may be connected in the transmission line, one may be connected to the output load, and the power of the second r.f. power amplifier operating at a different frequency may be fed in the fourth port in place of the usual balance load.

To achieve a sharper resonance in the loop, a secondary ring may be coupled to the loop, or other resonators may be used.

BRIEF DESCRIPTION OF THE DRAWINGS

Two combiners for r.f. power amplifier modules constructed in accordance with the invention will now be described by way of example with reference to the accompanying drawings, in which.

DETAILED DESCRIPTION OF THE PREFERRED EMBODIMENTS

Figure 1:
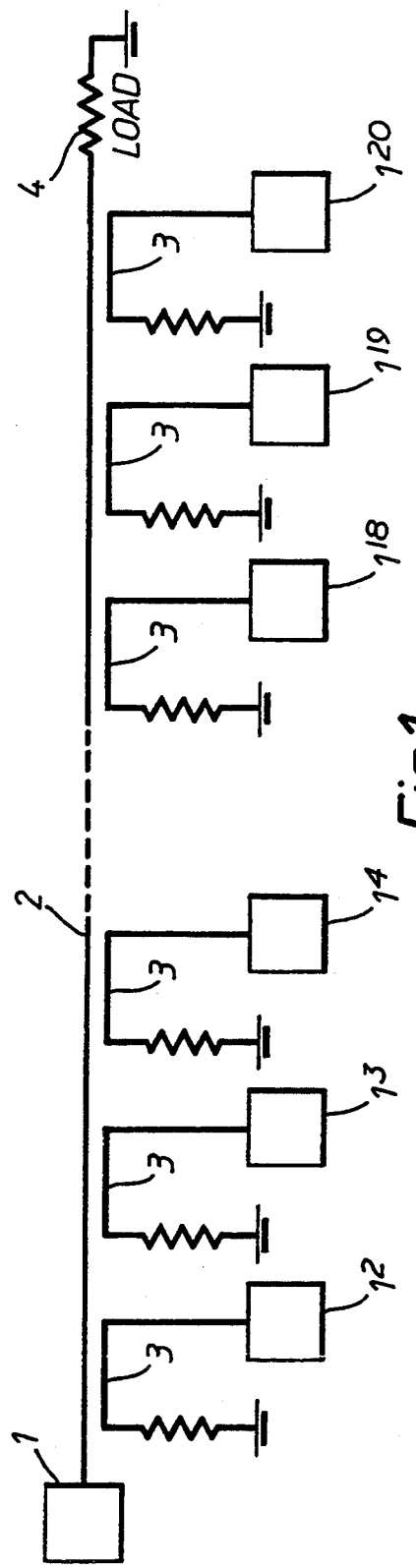
FIG. 1 illustrates the sequential coupling of a number of power amplifier modules on a transmission line.
Figure 3:
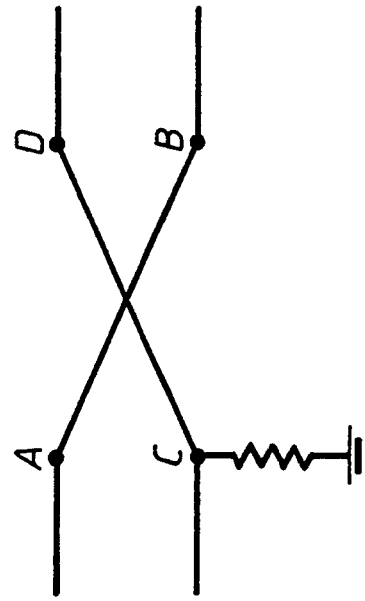
FIG. 3 illustrates a directional coupler in symbolic form dividing a first and a second signal into two parts having different phase shifts.
Figure 2:
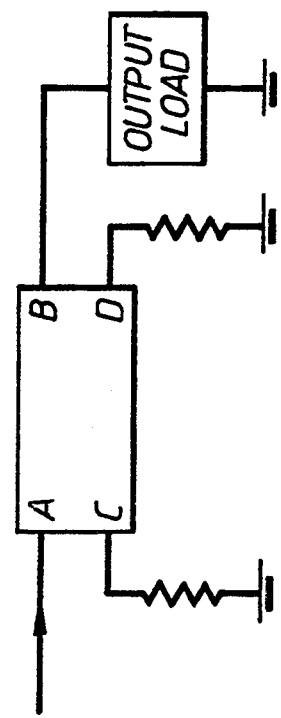
FIG. 2 illustrates a directional coupler.
Figure 4:
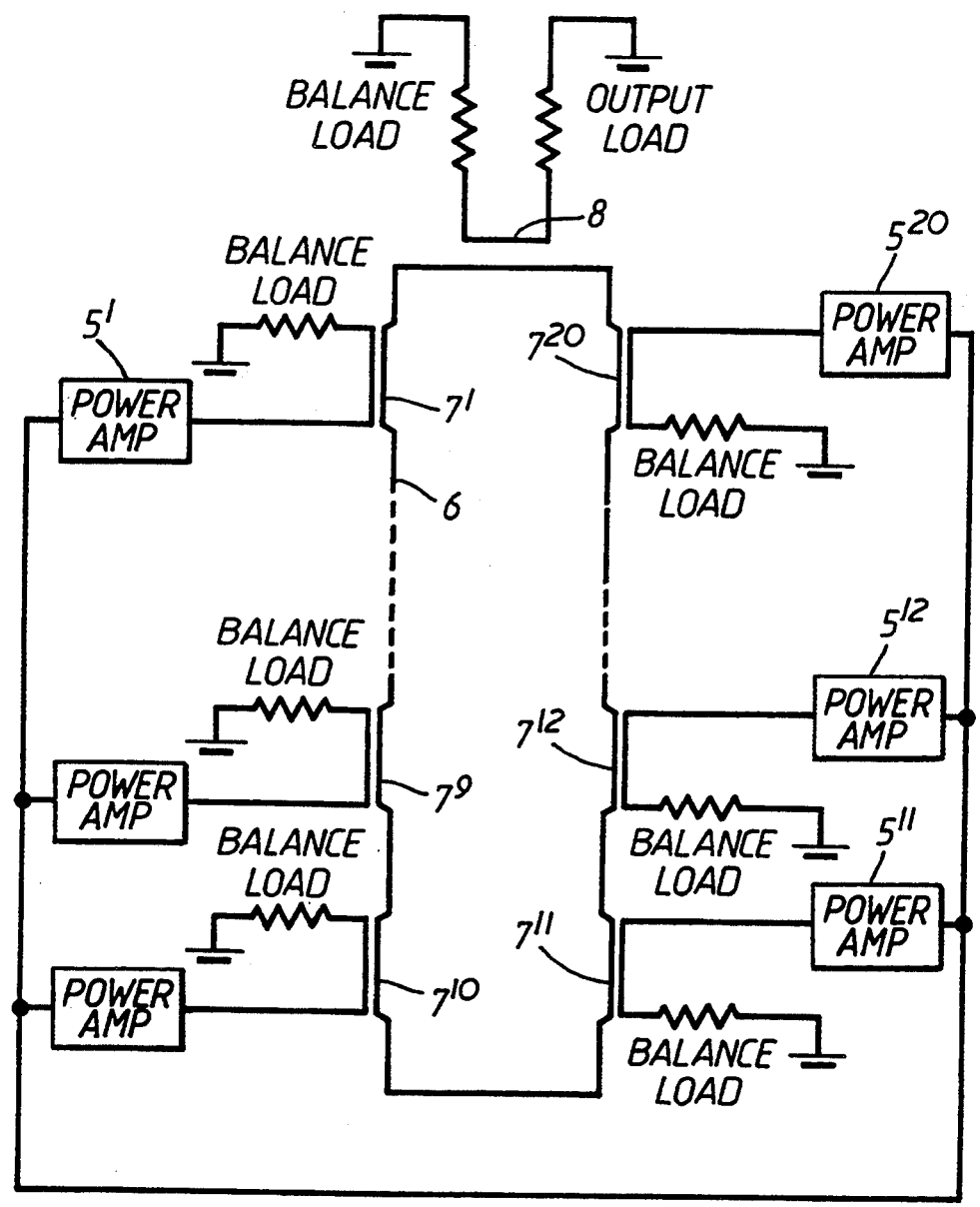
FIG. 4 is a schematic diagram of the first combiner for combining outputs of twenty modules operating at the same frequency.

Referring to FIG. 4 the 20 modules $5^1$-$5^{20}$ are identical power amplifiers, the centre frequency of each of which is 80 MHz and the output of each of which 1000 watt. Different frequencies or modules of different power output e.g. 500 watt may of course be used instead. Each module is coupled to a resonator in the form of a transmission line 6 by means of a respective directional coupler $7^1$-$7^{20}$. The transmission line is the centre conductor of a 50 ohm impedance coaxial cable, the outer sheath of which is earthed.

Each of the directional couplers $7^1$-$7^{20}$ consists of a conductor, which can be brought to a defined position parallel to and spaced apart by a certain distance from the centre conductor, and within the coaxial outer sheath. Other forms of directional coupler e.g. discrete components may be used instead. The modules may be made so that they can be physically plugged into the support for the transmission line 6.

The inputs of the modules are progressively delayed so that each module's output arrives on the resonant ring 6 in phase with the signal already there. The delay is the electrical distance around the ring from the first coupler $7^1$ to each subsequent coupler. The outputs of the modules are fed into one port of each directional coupler. The port connected by the conductor to this port is connected to a balance load of 50 ohms impedance. The other two ports on the transmission line itself are also matched to 50 ohms by virtue of the transmission line.

The combined power of the modules is withdrawn by a further directional coupler 8 which may be of similar construction to the couplers 7. Two ports are formed by the transmission line, and the two formed by the coupled length of cable are connected to an output load and a balance load, both matched to the 50 ohms impedance.

The coupling ratios of the directional couplers are chosen so that there is a circulating power in the transmission line greater than the combined output of the modules, in this case, four times greater. The coupling ratios of the directional couplers are chosen accordingly. Thus, the circulating power entering the directional coupler 8 is eighty times 1 kw. Only the actual power of the modules can be extracted i.e. 20 kw, so that coupling ratio is 6.02 dB=10 $\log_{10}$ 20/80. The coupling ratio of the directional coupler $7^1$ is 17.85 dB (10 $\log_{10}$ 61/1). The coupling ratio of the coupler $7^9$ is 18.39 dB (10 log 69/1) that of the coupler $7^{10}$ is 18.45 dB ($\log_{10}$ 70/1), that of the coupler $7^{11}$ is 18.51 dB ($\log_{10}$ 71/1), that of the coupler $7^{12}$ is 18.57 dB ($\log_{10}$ 72/1) and that of the coupler $7^{20}$ is 19.03 dB ($\log_{10}$ 80/1). In order that the power does build up around the loop, it is necessary that the length of the loop is an integral number of wavelengths of the centre frequency of the modules.

As the power in the resonant ring of feeder is four times that at the output, so the loss is four times that in an equivalent length feeder used as a straight line combiner. But as this is a section of high power feeder anyway, the actual loss is still very small.

As the modules are coupled to the main line via directional couplers, it would be possible to fit the complete side arm and balancing load to the module. This would remove the need for, and hence problems and costs of, r.f. plugs and sockets. This would make module testing easier as with the module on the test bench the balancing load now becomes the test load.

Compared to a sequential arrangement of modules on the transmission line, the arrangement of the invention has the advantage that the couplers $7^1$-$7^{20}$ all have approximately the same coupling ratio.

Figure 5:
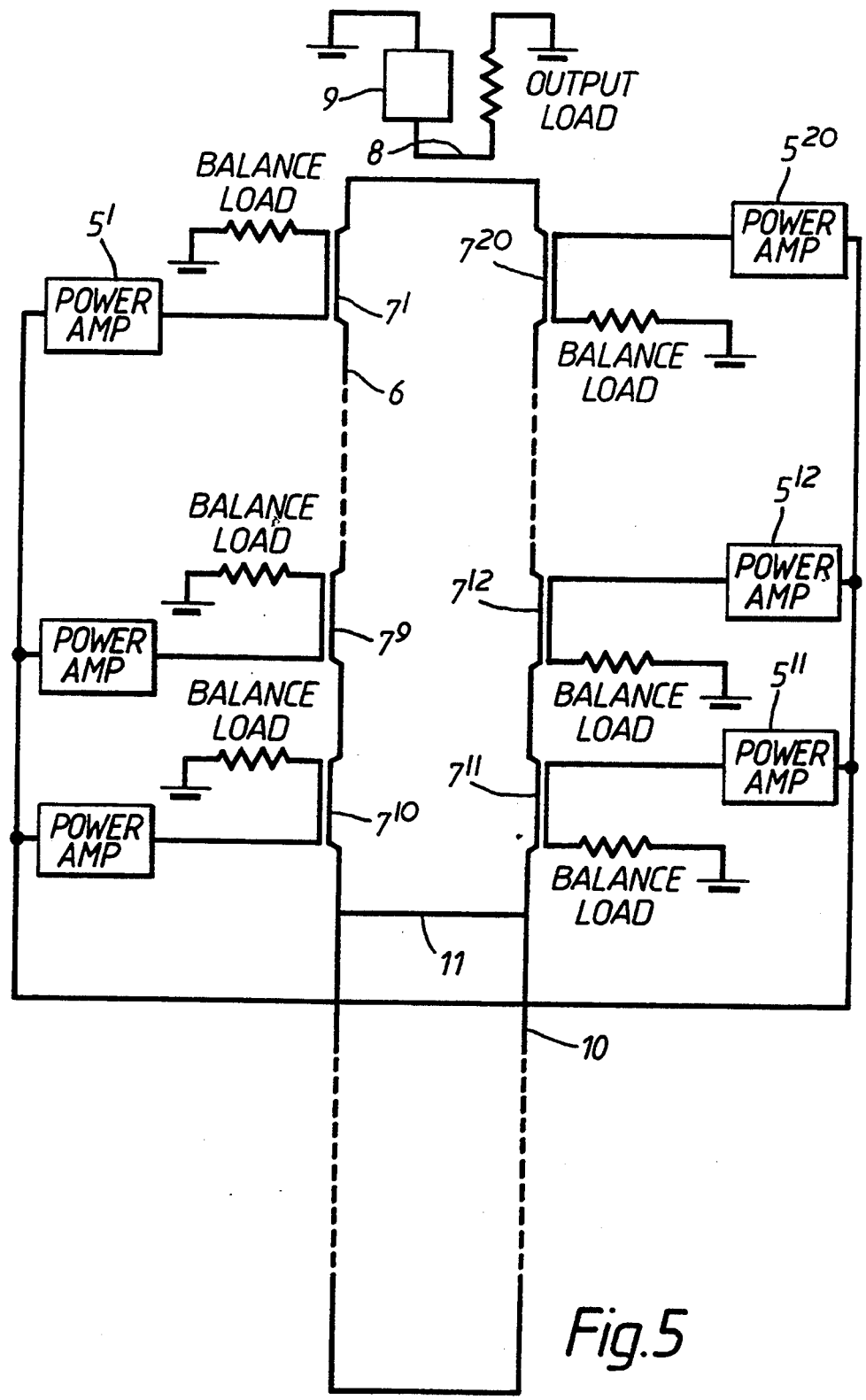
FIG. 5 is a schematic diagram of the second combiner for combining outputs of twenty modules operating at the same frequency with one r.f. power amplifier operating at a different frequency.

In the second combiner (FIG. 5), advantage is taken of the resonance effect arising from the length of the transmission line being an integral number of whole wavelengths of the operating frequency of the modules. The second combiner is similar to the first, except that the balance load for the coupler for withdrawing power is replaced by an r.f. power amplifier 9 operating at different frequency to that of the modules, and except that a secondary resonant ring is coupled to the transmission line 6. Like parts are given like reference numerals between FIGS. 4 and 5. The length of the secondary resonant ring 10 is an integral number of wavelengths of the operating frequency and it is coupled to the main ring by virtue of a coupling 11, which is a conductor of short length common to both rings. The purpose of the resonant ring is to provide a sharp cut-off of the passband of the main ring, which is centered on the operating frequency of the modules. The frequency of the r.f. power amplifier 9 lies outside the passband of the main resonant ring. Thus, the directional coupler 8 cannot operate in the usual manner and split its input between the main loop and the output load. Since none of the power can pass around the main resonant ring, it is all passed to the output load, where it is combined with the combined output of the modules $5^1$-$5^{20}$.

The power amplifier 9 may be for a sound signal and the modules may provide the vision signal of a television signal, so that the output load may be a transmitting aerial. Alternatively, the power amplifier 9 may have a combined sound and vision signal on one channel, which could itself be a combined signal from a number of modules, and the modules 5 could each carry combined sound and vision signals on another channel, so that the load would then carry two combined sound and vision signals on different channels. Alternatively, the module 9 on the one hand and the modules 5 in the other hand could carry two sound radio signals on different channels.

Various modifications in both embodiments are possible without departing from the scope of the invention. Thus, in both combiners, the circulating power could be a different multiple of the combined output powers of the modules e.g. three times. The only difference would be in the coupling ratios of the directional couplers, and the loss will also be different. Also, in both combiners, other resonators around which the r.f. energy can circulate may be used in place of the transmission lines. Thus, waveguides in the form of a loop may be used, or resonators with a rotating field may be used, such as the cavity resonator described in GB-A-1390809 or the plate resonator described in GB-A-1605120. In the second combiner, the secondary ring 10 or both rings 6, 10 may be of these types. For the second combiner of FIG. 5, there need not be a plurality of modules in the main loop, and could just be a single module in the main loop. Equally, the main loop may have a sharp enough resonance to avoid the need for an additional resonant ring or other resonator.

I claim:

1. A combiner for a plurality of r.f. power amplifiers having the same operating frequency as each other, comprising:
    a respective directional coupler for coupling the output of each r.f. power amplifier to a resonator to combine the outputs, the resonator being configured to define a continuous path for r.f. energy and being sized relative to the r.f. operating frequency such that, at the operating frequency, the resonator is resonant and r.f. energy circulates around the continuous path, and
    a directional coupler for withdrawing the combined output power from the resonator,
    wherein the coupling ratios of the directional couplers are such that in use the circulating power in the resonator is greater than the combined output power.

2. A combiner as claimed in claim 1, wherein the directional couplers each have a pair of ports connected to the resonator, one port connected to a balance load, and the other connected to the output of each r.f. power amplifier or, in the case of the coupler for withdrawing power, to the output load.

3. A combiner as claimed in claim 1, wherein the directional coupler for withdrawing the combined output power couples the output of a second r.f. power amplifier having a different operating frequency to produce a combined output.

4. A combiner as claimed in claim 1, wherein the circulating power is a multiple of the output power.

5. A combiner as claimed in claim 1, wherein the resonator is a continuous loop of transmission line.

6. A combiner for a plurality of r.f. power amplifiers having the same operating frequency as each other, comprising:
    a respective directional coupler for coupling the output of each r.f. power amplifier to a resonator around which the r.f. energy can circulate, to combine the outputs, the resonator being resonant at the operating frequency, and
    a directional coupler for withdrawing the combined output power from the resonator,
    wherein the coupling ratios of the directional couplers are such that in use the circulating power in the resonator is greater than the combined output power; and
    wherein the directional coupler for withdrawing the combined output power from the resonator couples the output of a second r.f. power amplifier having a different operating frequency to produce a combined output.

7. A combiner as claimed in claim 6, wherein the directional couplers each have a pair of ports connected to the resonator, one port connected to a balance load, and the other connected to the output of each r.f. power amplifier or, in the case of the coupler for withdrawing power, to the output load.

8. A combiner as claimed in claim 6, wherein the circulating power is a multiple of the output power.

9. A combiner as claimed in claim 6, wherein the resonator is a continuous loop of transmission line.

10. A combiner for a plurality of r.f. power amplifiers having the same operating frequency as each other, comprising:
    a respective directional coupler for coupling the output of each r.f. power amplifier to a resonator around which the r.f. energy can circulate, to combine the outputs, the resonator being resonant at the operating frequency, and
    a directional coupler for withdrawing the combined output power from the resonator,
    wherein the coupling ratios of the directional couplers are such that in use the circulating power in the resonator is greater than the combined output power; and
    wherein the resonator is a continuous loop of transmission line.

11. A combiner as claimed in claim 10, wherein the directional couplers each have a pair of ports connected to the resonator, one port connected to a balance load, and the other connected to the output of each r.f. power amplifier or, in the case of the coupler for withdrawing power, to the output load.

12. A combiner as claimed in claim 10, wherein the directional coupler for withdrawing the combined output power couples the output of a second r.f. power amplifier having a different operating frequency to produce a combined output.

13. A combiner as claimed in claim 10, wherein the circulating power is a multiple of the output power.

14. A combiner for two r.f. power amplifiers having different operating frequencies, comprising a directional coupler for coupling the output of a first r.f. power amplifier having one operating frequency on to a transmission line, the transmission line forming a continuous loop the length of which is an integral number of wavelengths of that operating frequency, and a directional coupler for withdrawing the output power of the r.f. amplifier from the continuous loop as well as for coupling the output of a second r.f. power amplifier having a different operating frequency to produce a combined output.

15. A combiner as claimed in claim 14, including a secondary resonator which is coupled to the transmission line referred to.

* * * * *